US008237918B2

(12) United States Patent
Totzeck et al.

(10) Patent No.: US 8,237,918 B2

(45) Date of Patent: Aug. 7, 2012

(54) OPTICAL SYSTEM OF A MICROLITHOGRAPHIC PROJECTION EXPOSURE APPARATUS

(75) Inventors: Michael Totzeck, Schwaebisch Gmuend (DE); Toralf Gruner, Aalen-Hofen (DE); Damian Fiolka, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 415 days.

(21) Appl. No.: 12/498,475

(22) Filed: Jul. 7, 2009

(65) Prior Publication Data

US 2009/0323042 A1 Dec. 31, 2009

Related U.S. Application Data

(63) Continuation of application No. PCT/EP2008/053847, filed on Mar. 31, 2008.

(60) Provisional application No. 60/909,734, filed on Apr. 3, 2007.

(51) Int. Cl.
*G03B 27/72* (2006.01)

(52) U.S. Cl. .......................... 355/71; 359/489.2; 362/19

(58) Field of Classification Search .................... 355/71, 355/67; 359/489.01, 489.02, 489.2; 362/19
See application file for complete search history.

(56) References Cited

U.S. PATENT DOCUMENTS

| | | | | |
|---|---|---|---|---|
| 6,191,880 | B1 | 2/2001 | Schuster | |
| 6,856,379 | B2 | 2/2005 | Schuster | |
| 2006/0170901 | A1 | 8/2006 | Tanitsu et al. | |
| 2007/0146676 | A1 | 6/2007 | Tanitsu et al. | |
| 2007/0188730 | A1* | 8/2007 | Takeuchi et al. | 355/71 |
| 2007/0195305 | A1* | 8/2007 | Mulder et al. | 355/71 |
| 2007/0263199 | A1 | 11/2007 | Fiolka et al. | |
| 2008/0024744 | A1* | 1/2008 | Van Horssen | 355/53 |
| 2008/0043236 | A1 | 2/2008 | Kaise et al. | |
| 2008/0218725 | A1 | 9/2008 | Fiolka | |
| 2008/0225260 | A1 | 9/2008 | Klaassen et al. | |

FOREIGN PATENT DOCUMENTS

| | | |
|---|---|---|
| DE | 195 35 392 | 3/1997 |
| DE | 101 24 803 | 11/2002 |
| EP | 1 821 149 | 8/2007 |
| JP | 2003-188087 | 7/2003 |
| JP | 2006-345005 | 12/2006 |

(Continued)

OTHER PUBLICATIONS

The International Preliminary Report on Patentability for the corresponding PCT Application No. PCT/EP2008/053847, dated Oct. 15, 2009.

(Continued)

*Primary Examiner* — Glen Kao

(74) *Attorney, Agent, or Firm* — Fish & Richardson P.C.

(57) ABSTRACT

An optical system, such as an illumination device or a projection objective of a microlithographic projection exposure apparatus, is disclosed. The optical system can include a polarization compensator which has at least one polarization-modifying partial element. The optical system can also include a manipulator by which the position of the at least one partial element can be altered. At least one operating mode of the optical system can be set in which the intensity, over a region which belongs to a plane perpendicular to the optical axis and which can be illuminated with light from the light source, does not exceed 20% of the maximum intensity in the plane, and the manipulator is arranged in the region.

27 Claims, 11 Drawing Sheets

FOREIGN PATENT DOCUMENTS

| | | | |
|---|---|---|---|
| JP | 2007-220767 | | 8/2007 |
| JP | 2008-108851 | | 5/2008 |
| WO | WO 2005/031467 | | 4/2005 |
| WO | WO 2005/083517 | | 9/2005 |
| WO | WO 2005119369 | A1 * | 12/2005 |
| WO | WO 2006/016584 | | 2/2006 |
| WO | WO 2006/077849 | | 7/2006 |
| WO | WO 2006/097135 | | 9/2006 |
| WO | WO 2007/031544 | | 3/2007 |

OTHER PUBLICATIONS

Japanese Office Action, with English translation, for corresponding JP Appl No. 2010-501496, dated Nov. 18, 2011.

* cited by examiner a)

b)

c)

d)

a)

a)

b)

OPTICAL SYSTEM OF A MICROLITHOGRAPHIC PROJECTION EXPOSURE APPARATUS

CROSS-REFERENCE TO RELATED APPLICATIONS

This application is a continuation of, and claims benefit under 35 USC 120 to, international application PCT/EP2008/053847, filed Mar. 31, 2008, which claims benefit of U.S. Ser. No. 60/909,734, filed Apr. 3, 2007. The contents of both of these applications are hereby incorporated by reference in its entirety.

FIELD

The disclosure relates to an optical system, such as an illumination device or a projection objective of a microlithographic projection exposure apparatus, in which it is possible to exert a comparatively flexible and rapid influence on the polarization state.

BACKGROUND

In projection exposure apparatuses, in particular with a projection objective having a high numerical aperture (e.g., a numerical aperture of greater than 1.3), targeted forming of the polarization state both in the illumination device and in the projection objective is often desirable for the purpose of obtaining high resolutions. In this case, in the illumination device and also in the projection objective, a polarization state initially set can be influenced by various effects in an undesirable manner. The effects include, for example, a stress birefringence present in the lens material (e.g., due to mount-induced forces, compaction, and/or thermal effects), polarization-induced birefringence, a birefringence present in anti-reflective or highly reflective layers on the optical components (e.g., due to form birefringence or due to different Fresnel reflection and transmission for orthogonal polarization states), and/or an intrinsic birefringence of the lens material.

SUMMARY

In some embodiments, the disclosure provides an optical system, such as an illumination device or a projection objective of a microlithographic projection exposure apparatus, which enables comparatively flexible and rapid influencing of the polarization state.

In certain embodiments, the disclosure provides an optical system, such as an illumination device or a projection objective of a microlithographic projection exposure apparatus. The optical system includes a polarization compensator which has at least one polarization-modifying partial element. The optical system also includes a manipulator, by which the position of the at least one partial element can be altered. At least one operating mode can be set in which the intensity, over a region which belongs to a plane perpendicular to the optical axis and which can be illuminated with light from the light source, does not exceed 20% of the maximum intensity in the plane. The manipulator is arranged in the region.

The disclosure is based, in part at least, on the consideration that in the illumination device, for instance, generally the maximum possible region of a specific plane (e.g., the pupil plane) is not illuminated, rather specific illumination settings each with a specifically localized pupil illumination are used. Conventional illumination settings are, for example, an illumination setting with "small sigma" (FIG. 5*a*), in which the illuminated region is small relative to the pupil diameter and which is used in particular in conjunction with phase-shifting masks, an annular illumination setting (FIG. 5*b*) in conjunction with structures of different orientations, a "C-quad" setting (with poles on the x- and y-axis of the pupil, cf. FIG. 5*c*), or a "quasar" illumination setting (with poles on the ±45° axes of the pupil, cf. FIG. 5*d*). In the case of these illumination settings, a region that can be illuminated with light from a light source assigned to the optical system (in particular in the pupil plane) in each case typically remains at least substantially unilluminated. It is possible to effect comparatively flexible and rapid influencing of the polarization state by arranging a manipulator in the at least substantially unilluminated region.

As can be also seen from FIG. 5*a-d*, regions that are illuminated in certain settings remain unilluminated in other settings. For example, the central region in the "small sigma"-setting of FIG. 5*a* is (substantially) the only illuminated region in this setting, and this region is not illuminated, for example, in the quadrupole settings of FIGS. 5*c,d* or in the annular setting of FIG. 5*b*. Furthermore, generally each one of these settings as well as other settings (e.g., with quantitatively modified dimensions of the illuminated regions) may be used in a microlithographic exposure apparatus, and changeovers from one setting to the other setting are made.

To account for the fact that almost each region of the pupil plane may correspond to an optically used region when changing over between the different settings, a conventional approach is to arrange manipulators outside of the whole region that can be illuminated with the light source. The concept of the present disclosure turns away from such an approach by placing manipulator components in regions which principally may be illuminated, but remain at least substantially non-illuminated in one or more specific illumination setting(s) or in the actually used setting, respectively. The disclosure thereby exploits the fact that certain illumination settings provide the possibility to arrange manipulator components in certain regions where an arrangement was not arranged (to avoid disturbance of the illumination and imaging process), but becomes possible due to at least substantially optically non-used regions.

The above-mentioned "region" is not necessarily a continuous or uninterrupted region, but may be formed by two or more sub-regions or sub-areas. Furthermore, the manipulator may include several manipulator components, which are then referred to as the manipulator in its entirety.

In some embodiments, the optical system includes, in addition to the first manipulator, a second manipulator by which the position of the first manipulator can be altered. The second manipulator may be arranged outside the region which can be illuminated with the light source. Furthermore, the whole arrangement with optically used regions and manipulator components may be exchangeable (e.g., in a revolving device), and/or may be displaceable or rotatable.

Besides the use of certain regions for arranging manipulator components in a flexible manner, it is also possible to limit the size of polarization-modifying elements and thereby the amount of the material (e.g., optically active) used (which material may be, for example, rare and/or expensive) by flexibly adapting the position of the used elements to the respective illumination setting.

Specifying that over the region in which the manipulator is arranged the intensity does not exceed 20% of the maximum intensity in the plane, expresses that the respective region is not necessarily completely non-illuminated, but may still contain in the selected operating mode some residual intensity depending of the respective mode or illumination setting. In certain embodiments, the disclosure proposes to arrange the manipulator in a plane perpendicular to the optical axis such that a maximum fraction of 20% (e.g., a maximum fraction of 10%, a maximum fraction of 5%) of the total intensity of the illumination light in the plane falls onto the manipulator.

In principle, the plane can be any above-noted plane perpendicular to the optical axis in the optical system. In certain embodiments, the above-noted plane perpendicular to the optical axis is a pupil plane of the optical system. The regions available for arranging one or more manipulators may be relatively pronounced in this case.

For a quantitative specification of the illumination settings shown in FIG. 5*a*-5*d*, and just by way of an example, the illumination setting of FIG. 5*a* may have a value of σ (or "sigma", defined as the ratio of the small radius of the illuminated region and the large radius of the substantially non-illuminated region) of σ≈0.15 (or σ may have typical values in a range between 0.12 and 0.2). For the annular illumination setting of FIG. 5*b*, the illuminated annular region may be described by typical Δσ-values in a range between 0.10 and 0.15 (e.g., Δσ≈0.12), corresponding, for example, to σ-values of 0.80 and 0.95. For the quadrupole or quasar illumination settings of FIGS. 5*c* and 5*d*, the illuminated pole regions may be described by a pole aperture angle having typical values in the range from 20° to 30° (e.g., 25°) and typical Δσ-values in a range between 0.10 and 0.15 (e.g., Δσ≈0.12), corresponding, for example, to σ-values of 0.80 and 0.95. This corresponds to a minimum filling degree of the pupil of 1.44%.

Depending on the desired properties with regard to uniformity, telecentry and ellipticity (being caused by light being non-symmetrically coupled-out, for example, in the pupil plane), a further quantitative parameter may be that not more than 1% (e.g., not more than 0.2%, not more than 0.1%) of the optically used region are covered by the manipulator (or its components).

In some embodiments, the at least one partial element is composed of birefringent material.

In certain embodiments, the at least one partial element modifies, for light passing through the partial element, the ratio of the amplitudes of orthogonal polarization states. Such elements modifying the ratio of the amplitudes of orthogonal polarization states (an effect which is also sometimes referred to as "diattenuation") can, by way of an example, be designed as diffractive grating polarizers. Furthermore, such elements modifying the ratio of the amplitudes of orthogonal polarization states can also be designed as inclined plates being made of a dielectric material such as fused silica ($SiO_2$) (wherein such plates may or may not include an additional coating).

In certain embodiments, the at least one partial element modifies, for light passing through the partial element, the relative phase between orthogonal polarization states, which effect can be achieved by composing the partial element of birefringent material.

Furthermore, the at least one partial element can also be designed such that both the aforementioned effects of (a) changing the ratio of the amplitudes of orthogonal polarization states or (b) changing the relative phase between orthogonal polarization states are combined by the partial element.

In some embodiments, the plane perpendicular to the optical axis can also be a field plane of the optical system. This makes it possible, for example, to exploit the fact that in a scanner generally only a slotted region of the field is used, such that one or more manipulators can be introduced into the unused region of the field (which is "disjointed" with respect to the slot).

The disclosure furthermore relates to a microlithographic projection exposure apparatus, a method for the microlithographic production of microstructured components, and a microstructured component.

BRIEF DESCRIPTION OF THE DRAWINGS

The disclosure is explained in more detail below on the basis of embodiments with reference to the accompanying drawings, in which.

DETAILED DESCRIPTION

FIG. 1*a-b* show a schematic illustration of a polarization compensator 100. The polarization compensator 100 includes four partial elements 110, 120, 130 and 140, which in each case have a circular geometry and are produced from birefringent (optically uniaxial) crystal material. In an exemplary embodiment, the birefringent material is crystalline quartz, but may alternatively also be some other suitable material that is sufficiently light-transmissive for light at the operating wavelength (e.g., 193 nm), such as, for example, magnesium fluoride ($MgF_2$) or sapphire ($Al_2O_3$). The orientation of the fast axis of the birefringence in the individual partial elements 110-140 is in each case indicated by the double-headed arrows depicted in FIG. 1*a-b*. In this case, the thickness of the polarization compensator 100 or of its partial elements is chosen such that the resulting phase difference between two orthogonal polarization states (the so-called "retardation") is the negative of the retardation occurring for this region in the optical system, that is to say precisely compensates for the retardation.

Figure 6:
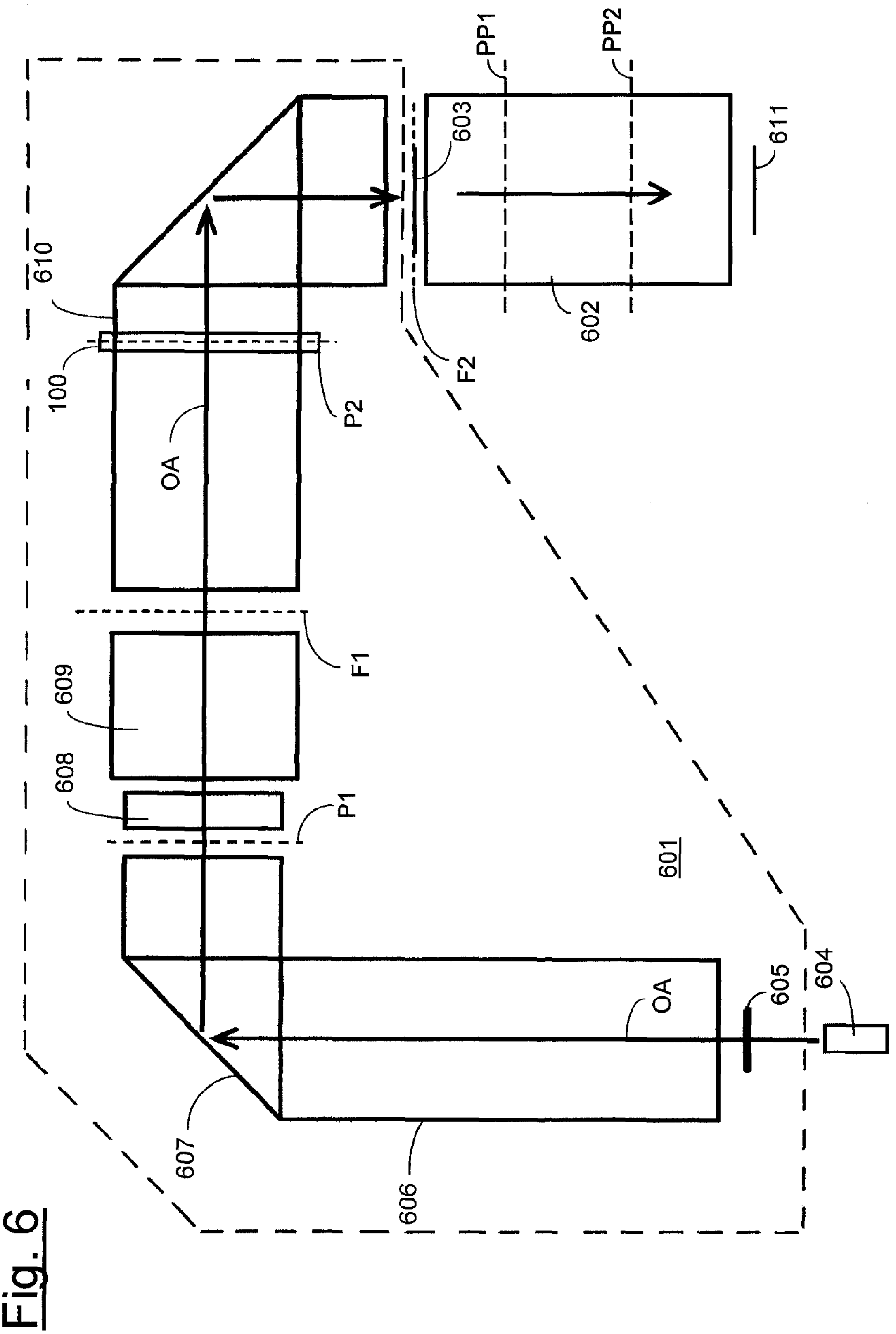
FIG. 6 shows a schematic illustration of the basic construction of a microlithographic projection exposure apparatus.

In accordance with an exemplary embodiment, the polarization compensator 100 is situated in a pupil plane of an illumination device of a microlithographic projection exposure apparatus, as is explained with reference to FIG. 6, which schematically shows the basic construction of such a microlithographic projection exposure apparatus.

The microlithographic projection exposure apparatus has an illumination device 601 and a projection objective 602. The illumination device 601 serves for illuminating a structure-bearing mask (reticle) 603 with light from a light source unit 604, which includes for example an ArF laser for an operating wavelength of 193 nm, an $F_2$ laser with an operating wavelength of 157 nm or an $Ar_2$ laser for an operating wavelength of 126 nm, and also a beam shaping optic that generates a parallel light bundle.

In accordance with an exemplary embodiment, the parallel light bundle of the light source unit 604 firstly impinges on a diffractive optical element 605 (also referred to as "pupil defining element"), which generates a desired intensity distribution via an angular emission characteristic defined by the respective diffracting surface structure in a pupil plane P1.

Figure 5:
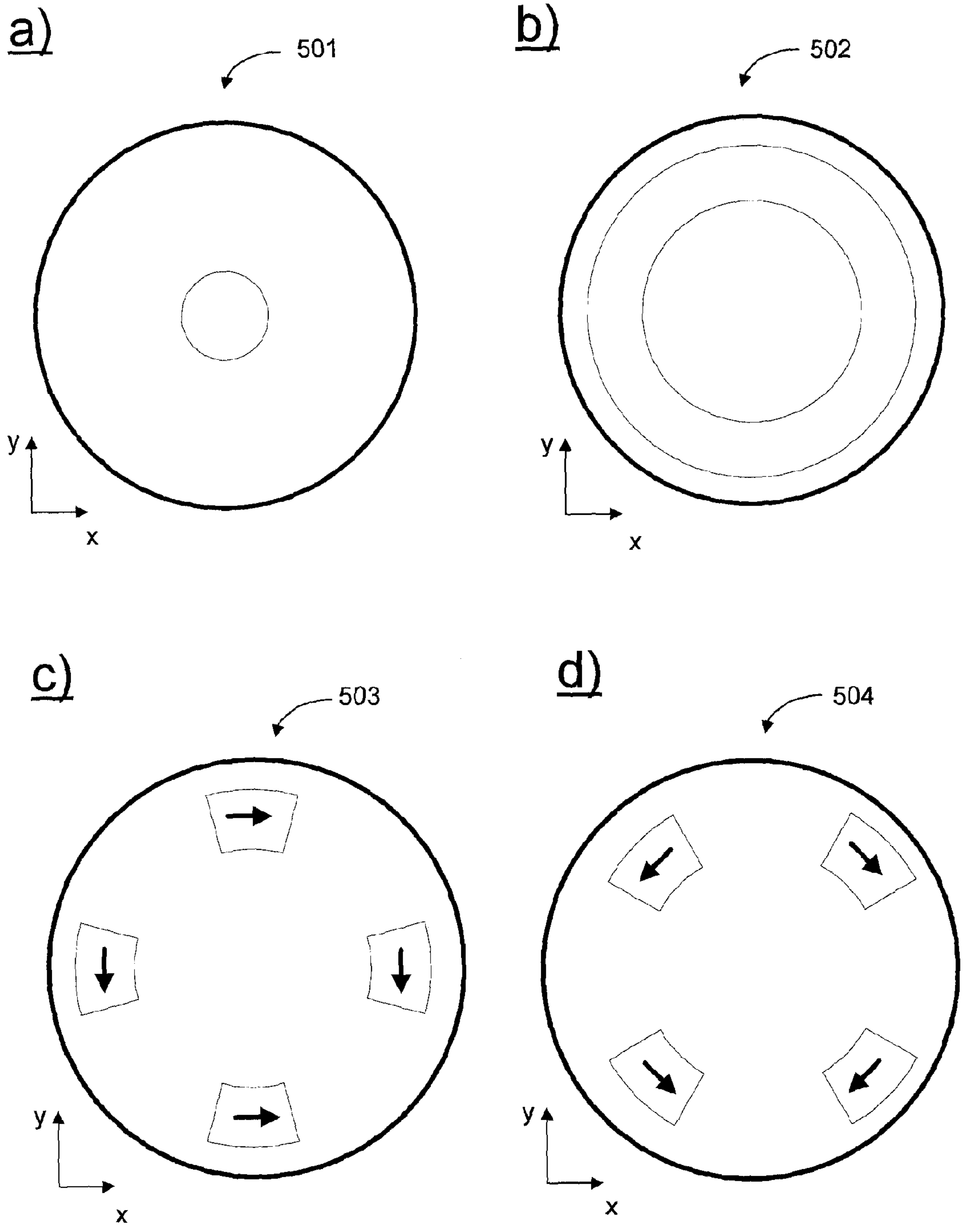
FIGS. 5*a-d* show diagrams for elucidating different illumination settings that can be set in an optical system.

An optical unit 606 is situated downstream of the diffractive optical element 605 in the direction of light propagation, the optical unit having a zoom objective, which generates a parallel light bundle with a variable diameter, and also an axicon. Via the zoom objective in conjunction with the upstream diffractive optical element 605, different illumination configurations are generated in the pupil plane P1 depending on the zoom position and the position of the axicon elements. Typical illumination settings which can be set in the illumination device 601 and are desired depending on, for example, the mask used are illustrated schematically in FIG. 5*a-d*, where FIG. 5*a* shows a so-called illumination setting with "small sigma" (also referred to as "small-sigma" setting), FIG. 5*b* shows an annular illumination setting, FIG. 5*c* shows a quadrupole illumination setting, also referred to as "C-quad" setting, and FIG. 5*d* shows an illumination setting, also referred to as "quasar" setting, in which the four poles of the quadrupole are arranged in a manner rotated about the z-axis by in each case 45° with respect to the x- and y-axis relative to the "C-quad" setting.

In the example illustrated, the optical unit 606 furthermore includes a deflection mirror 607. In the beam path a light mixing device 608 is situated downstream of the pupil plane P1 in the direction of light propagation, which light mixing device may have, for example, in a known manner, an arrangement of micro-optical elements that is suitable for obtaining light mixing. The light mixing device 608 is followed, in the direction of light propagation, by a lens group 609, downstream of which is situated a field plane F1 with a reticle masking system (REMA), which is imaged by an REMA objective 610—situated downstream in the direction of light propagation—onto the structure-bearing mask (reticle) 603 arranged in the field plane F2 and thereby delimits the illuminated region on the reticle. The structure-bearing mask 603 is imaged by the projection objective 602, which has two pupil planes PP1 and PP2 in the example illustrated, onto a substrate 611 provided with a light-sensitive layer, or a wafer.

In the illumination device 601 and/or the projection objective 602, one or a plurality of polarization manipulators according to the disclosure can now be used in the respective pupil planes, the construction and functioning of the manipulators being explained in greater detail below. FIG. 6 shows merely by way of example the arrangement of one polarization compensator 100 in the pupil plane P2 situated within the REMA objective 610.

Referring to FIG. 1*a-b* again, the four partial elements 110-140 of the polarization compensator 100 are in each case arranged within a light-opaque screen 160 covering the remaining region of the pupil plane and are mounted in the screen such that they can rotate about an axis parallel to the optical system axis OA (running in the z direction in the system of coordinates depicted) of the illumination device. The rotation of the partial elements 110-140 about their respective rotation axis parallel to the optical system axis OA can be carried out independently of one another for the individual partial elements 110-140 by a manipulator 150, which is only indicated schematically in FIG. 1*a-b* and is arranged in that region of the pupil plane which is covered by the light-opaque screen 160, i.e. in the unused region of the pupil plane.

The manipulator 150, which is only schematically adumbrated in FIG. 1*a-b*, can, in principle, be designed in any desired manner for enabling mutually independent rotations of the partial elements 110-140 and include, for example, belt drives, solid-state articulation elements, piezoelectric actuators, pneumatically or hydraulically driven bellows, Lorentz coils or combinations of these known components. In some embodiments, the position can be altered using wires or bands which may be pulled from outside (of the optically used region) and which may transfer the desired forces for altering the position of the polarization-modifying elements by frictional connection or by form-fit. Such wires, bands or the like are advantageous in such that they may be realized with particularly small diameters in order to block out relatively low amounts of light even where they pass the optically used region.

Furthermore, the whole arrangement with optically used regions and manipulator components may be realized exchangeable, for example, in a revolving device), and/or may be displaceable or rotatable (e.g., by angles of 45°, 30° and/or 22.5°).

Exemplarily embodiments of the manipulator are explained in more detail further below with reference to FIG. 8-10.

As can be seen from the orientations of the fast axes of the birefringence as indicated in FIG. 1*a-b*, FIG. 1*b* shows the polarization compensator 100 in a position in which the four partial elements 110-140 are in each case rotated by different rotation angles about the respective element axis parallel to the optical system axis OA, relative to the starting position of FIG. 1*a*. This rotation is carried out in such a way that the polarization compensator 100 is adapted to a real polarization distribution measured previously in the illumination device (or determined from measurements of individual components or modules of the illumination device).

In this case, the polarization compensator 100 can be arranged, relative to the direction of light propagation, both downstream and upstream of a polarization disturbance to be compensated for in the optical system, a bias for the polarization disturbance being created in the last-mentioned case.

The configuration of the polarization compensator 100 in accordance with FIG. 1*a-b* is particularly suitable in conjunction with a quadrupole illumination setting, also referred to as "C-quad" setting, that is set in the illumination device, as is illustrated schematically in FIG. 5*c*. It goes without saying that when the entire arrangement is rotated by 45°, the polarization compensator 100 is also suitable in conjunction with an illumination setting, also referred to as "quasar" setting, such as is shown in the schematic illustration of FIG. 5*d* and in which the four poles of the quadrupole are arranged in a manner rotated about the z-axis by 45° in each case with respect to the x- and y-axis.

FIG. 2*a-b* show a polarization compensator 200, which includes a first partial element 210 composed of birefringent (optically uniaxial) crystal material (e.g., crystalline quartz) of circular geometry, and also a second partial element 220, which is arranged concentrically with respect to the first partial element and also with respect to the optical system axis OA and which has a ring-shaped geometry such that the internal diameter of the ring corresponds to the external diameter of the first partial element 210. In certain embodiments (not illustrated), the second partial element 220 can also partly or completely overlap the first partial element 210, that is to say in particular also likewise be formed as a circular disk.

The orientations of the optical crystal axes of the respective uniaxial material of the first partial element 210 and of the second partial element 220 are once again indicated by the double-headed arrows depicted in FIG. 2*a-b*.

FIG. 2*a-b* likewise once again show a light-opaque screen 260, which covers a partial region of the pupil and on which is arranged a merely schematically indicated manipulator 250. Via the manipulator 250, the two partial elements 210 and 220 can be rotated about the optical system axis OA independently of one another, in which case the manipulator 250 can be embodied in any desired manner, in principle, analogously to the FIG. 1.

Figure 2:
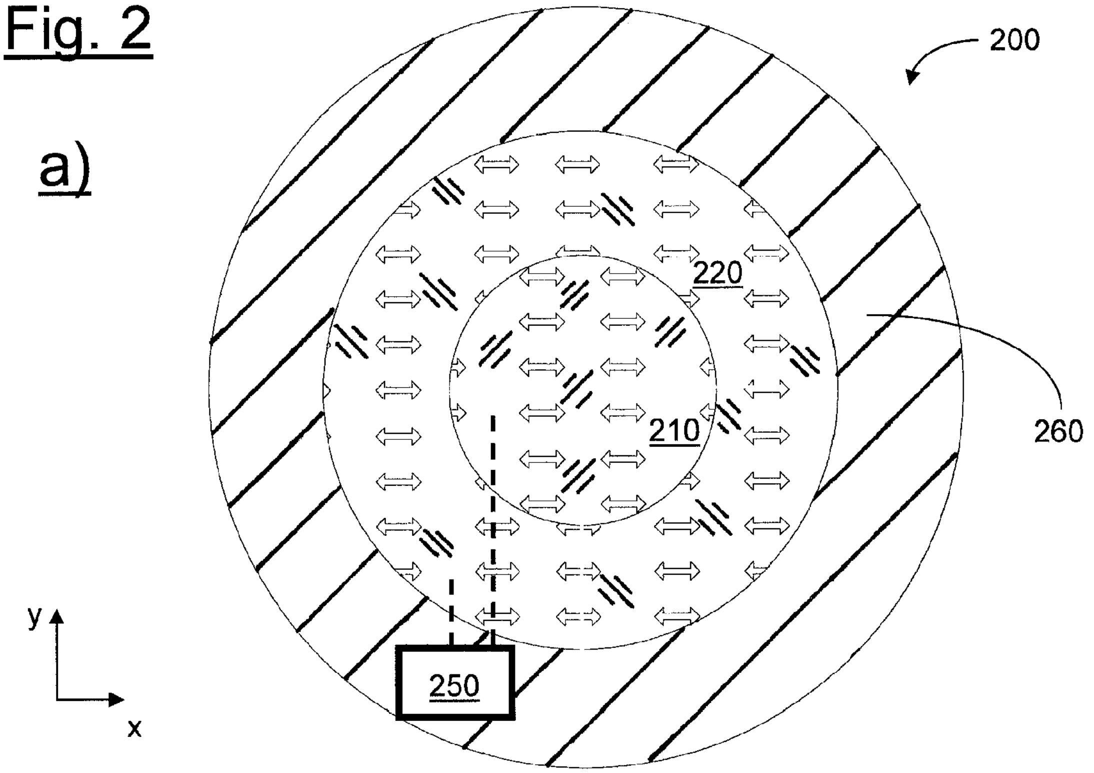
FIGS. 2*a-b* show schematic illustrations of a polarization compensator in different settings.
Figure 2:
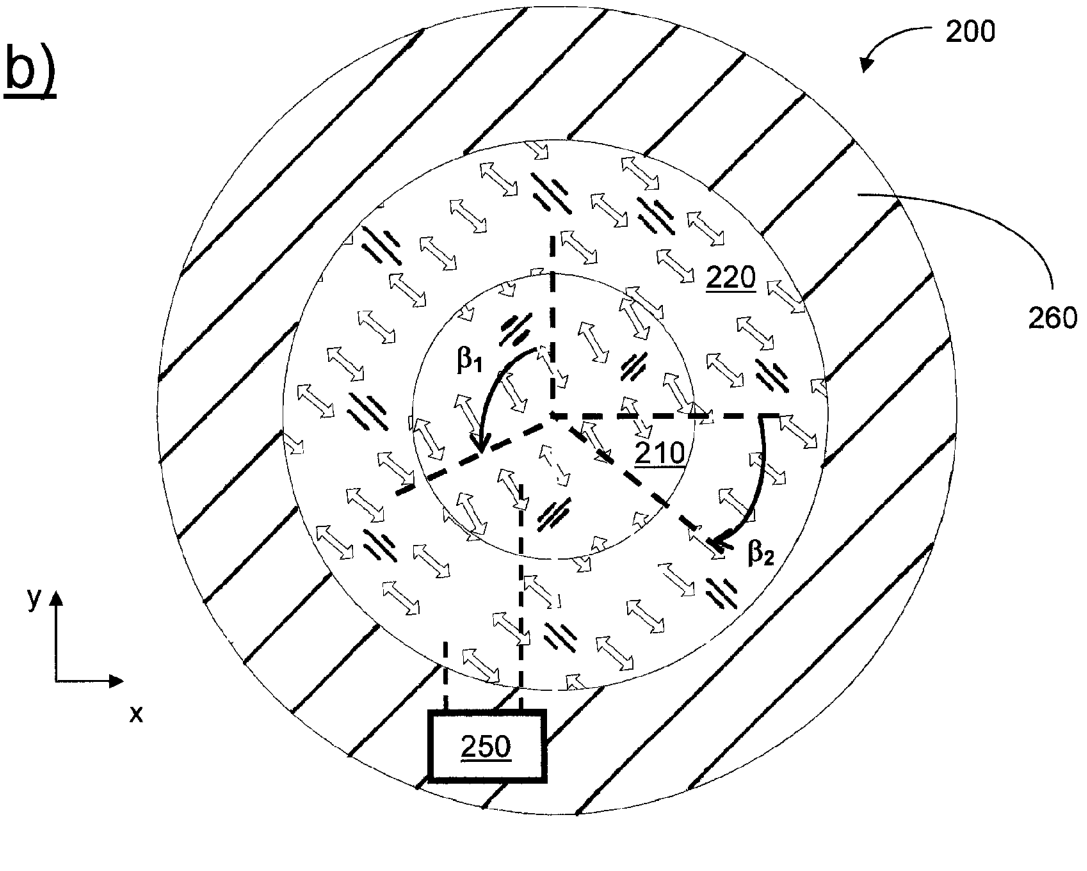

The polarization compensator 200 illustrated in FIG. 2 is particularly suitable in particular in conjunction with an illumination setting with "small sigma" (also referred to as "small-sigma" setting) in accordance with FIG. 5*a* or an annular illumination setting in accordance with FIG. 5*b*.

As shown by a comparison of the illustrations of FIG. 2*a* and 2*b*, in the setting of the polarization compensator 200 in accordance with FIG. 2*b*, the optical partial elements 210 and 220 are rotated about the optical system axis OA by different angles $\beta_1$ and $\beta_2$, respectively, relative to the starting position shown in FIG. 2*a* (with in each case horizontal orientation of the optical crystal axis). In this case the orientations of the central partial element 210 and of the ring-shaped partial element 220 arranged concentrically with respect thereto that are illustrated in FIG. 2*b* once again correspond in each case to the settings which were determined on the basis of a measurement of the real polarization distribution in the illumination device or the projection objective or were determined from measurements of the real polarization effect of individual components or modules.

Figure 1:
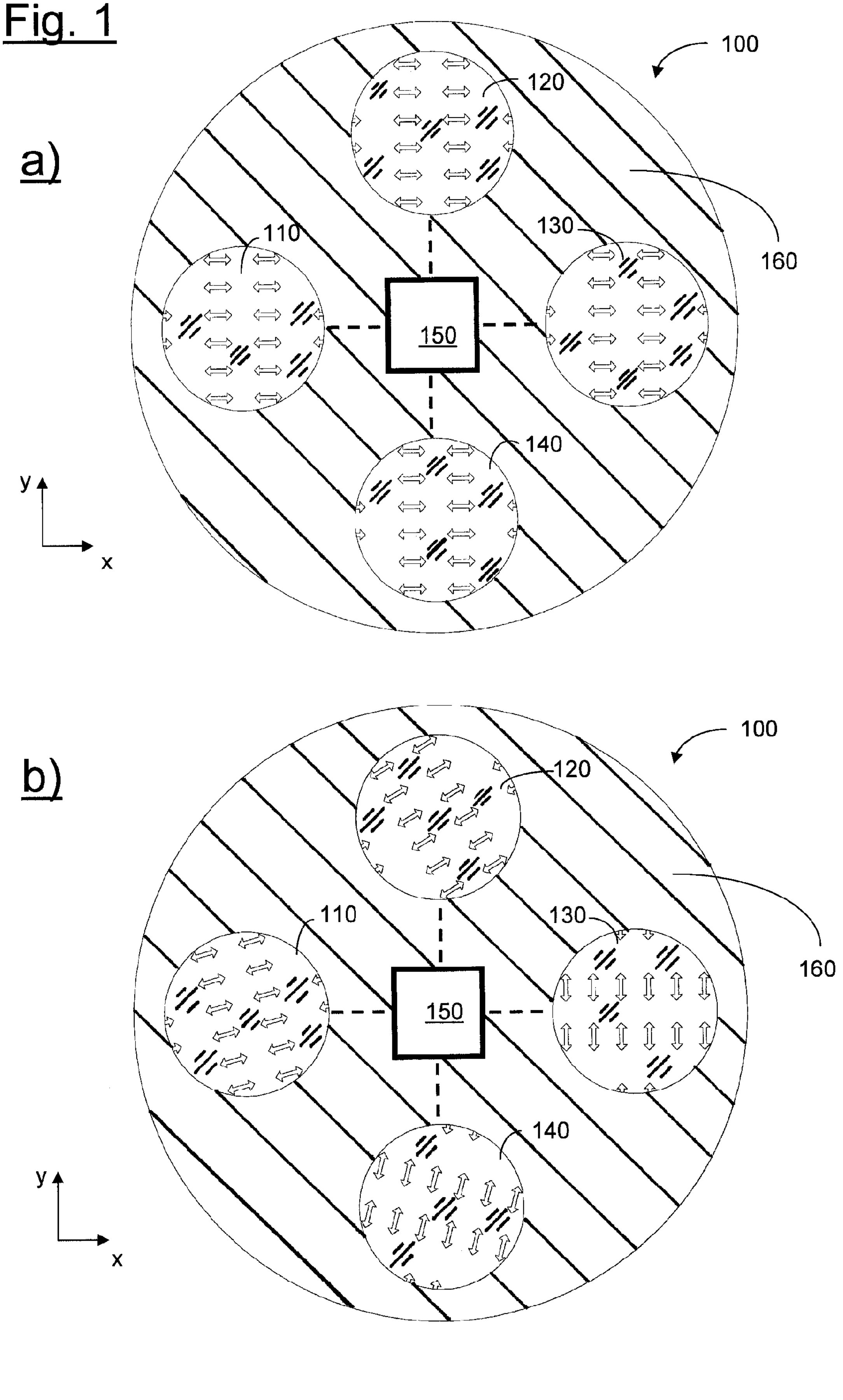
FIGS. 1*a-b* show schematic illustrations of a polarization compensator in different settings.

The configuration of the polarization compensator according to the disclosure is not restricted to the symmetrical configurations illustrated in FIGS. 1 and 2. Rather, a targeted asymmetrical configuration of the polarization compensator may also be advantageous depending on the specific conditions. In particular, in some embodiments, the polarization compensator may be configured in such a way that a gravitation-induced stress birefringence present in the optical system (i.e. the illumination device or the projection objective) is compensated for by a suitable "bias" of the polarization compensator. For this purpose, for instance the optically effective thickness of the respective partial elements of the polarization compensator can be varied (e.g., tapered) in a targeted manner in the direction of gravity in order to take account of a system-inherent gravitation-dictated variation of the polarization distribution in the direction of gravity.

The configurations of a polarization compensator which are shown in FIGS. 1 and 2 are in each case embodiments in which the respective partial elements represent comparatively strongly "integral" elements, which should be understood here to mean that the polarization-influencing effect of the partial elements is constant over a partial region of the pupil plane which is relatively large in comparison with the structures of the polarization distribution which are ultimately to be influenced or compensated for in the optical system. The consequence of this is that although the polarization compensator typically reduces a polarization disturbance present in the optical system in one partial region of the pupil, in return it magnifies the disturbance in another partial region of the pupil. The use of such relatively strongly "integral" elements which nevertheless ensues is based on the following insight of the inventors:

If the difference in the IPS value (IPS="Intensity in Preferred State") that is brought about by a retardation $\Delta\phi$ introduced into the system by the polarization compensator is considered, then the following quadratic relationship holds true for this:

$$\Delta IPS=\sin^2(\Delta\phi/2)*\sin^2(2*\alpha) \quad (1),$$

where $\Delta\phi$ designates the retardation and $\alpha$ designates the angle of the fast axis of the retardation with respect to the preferred direction of polarization of the incident light.

Owing to the quadratic relationship following from equation (1) between the introduced retardation $\Delta\phi$, on the one hand, and the resultant difference in the IPS value, on the other hand, it is possible, if appropriate, to accept a deterioration in an existing polarization disturbance in certain regions of the pupil since the deterioration is more than made up for by an improvement in other regions of the pupil. If, by way of example, the by a polarization disturbance present in the system corresponds to a retardation of 0 nm in a first region of the pupil and to a retardation of 20 nm in a second region of the pupil, owing to the quadratic relationship in accordance with equation (1), the "integral" introduction of a constant retardation of −10 nm, for example, by the partial elements of the polarization compensator according to the disclosure admittedly brings about a certain deterioration in the first partial region, but brings about an improvement in the second partial region that outweighs the deterioration. The resultant situation or polarization characteristic is advantageous relative to the starting situation insofar as the original IPS distribution with a large IPS loss in regions has been replaced by a more homogenous distribution with a lower maximum value of the IPS loss.

Furthermore, the polarization compensator according to the disclosure is not restricted to the rotations of partial elements of the polarization compensator which take place independently of one another as described with reference to FIGS. 1 and 2. As is explained below with reference to FIGS. 3 and 4, the influence of the manipulator used in each case can also consist in a temporary pushing out of one or more partial elements followed by a renewed pushing in of the relevant partial elements of the polarization compensator in a changed position.

Figure 3:
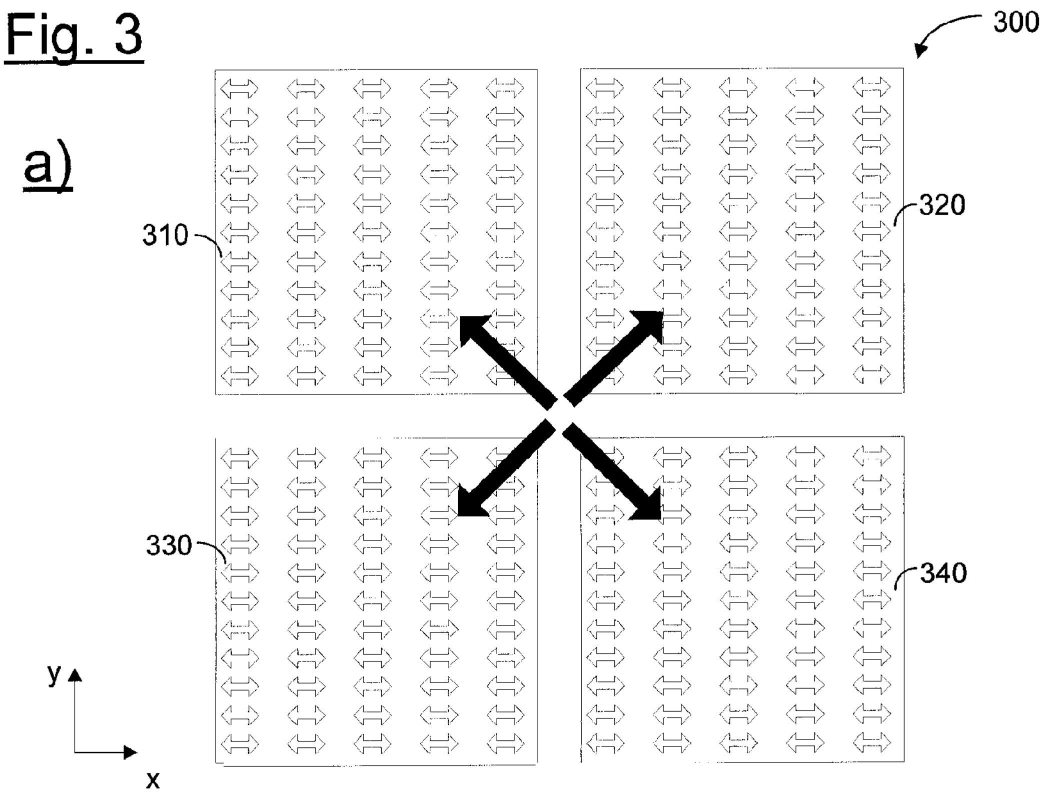
FIGS. 3*a-d* show schematic illustrations for elucidating the functioning of a polarization compensator.
Figure 3:
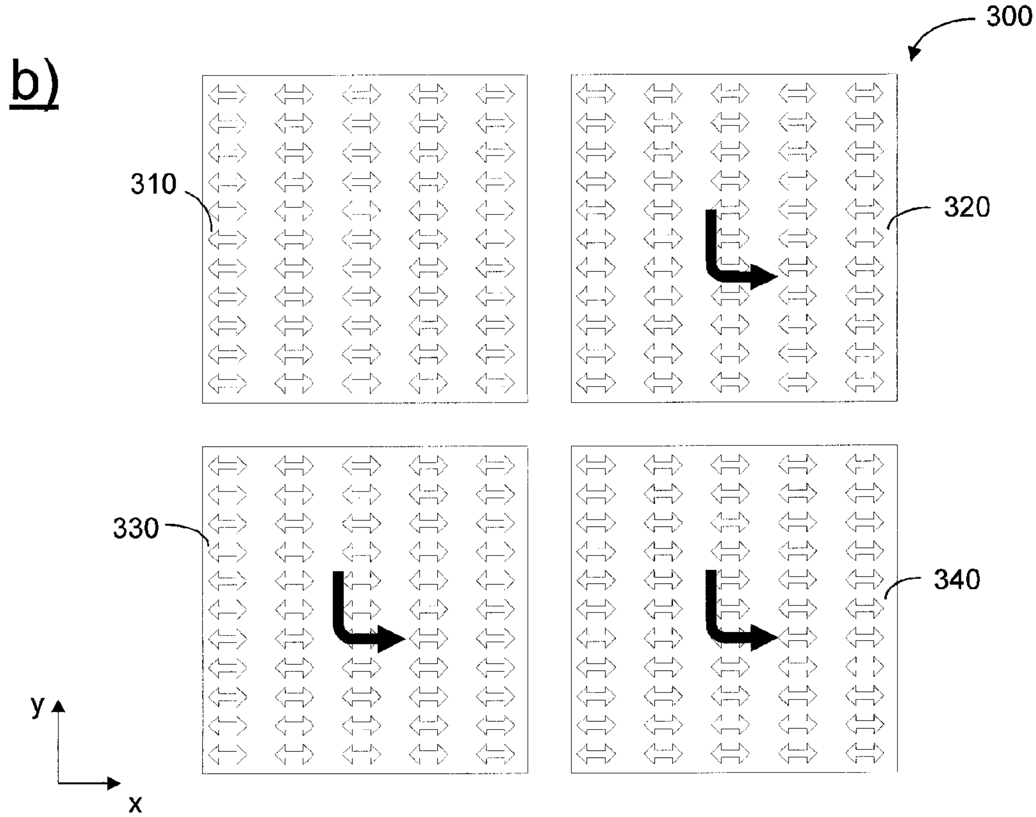
Figure 3:
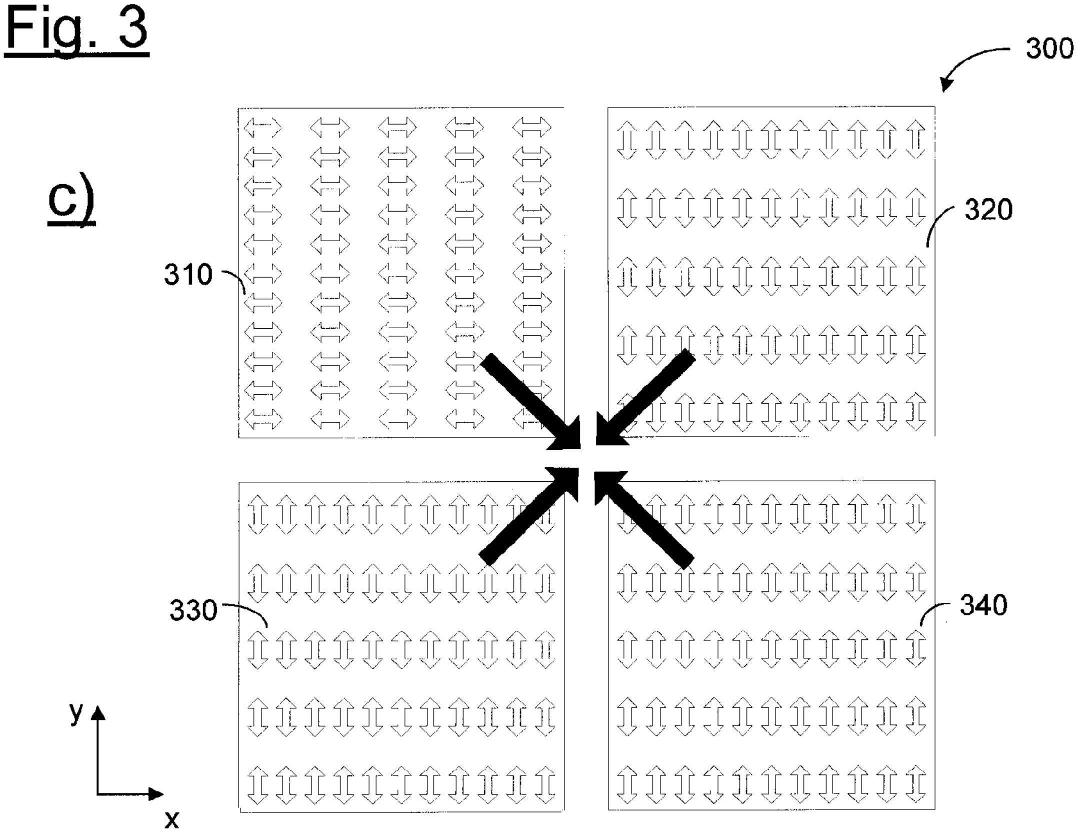
Figure 3:
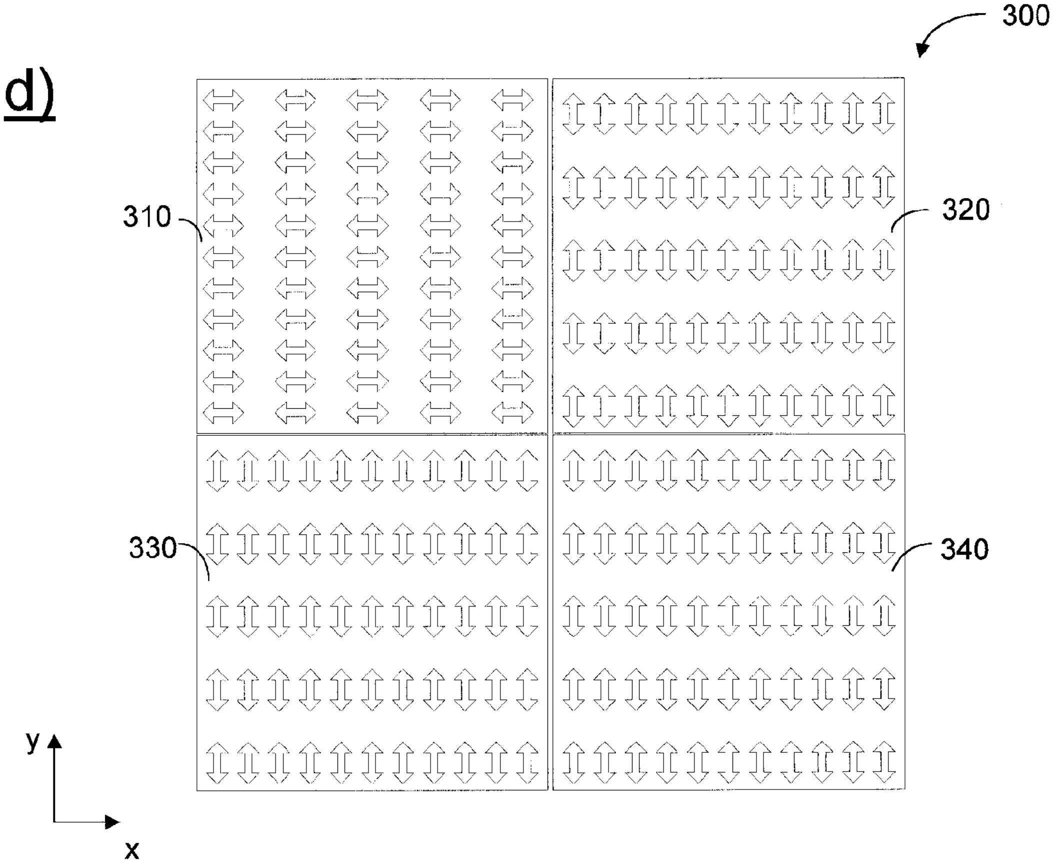
Figure 4:
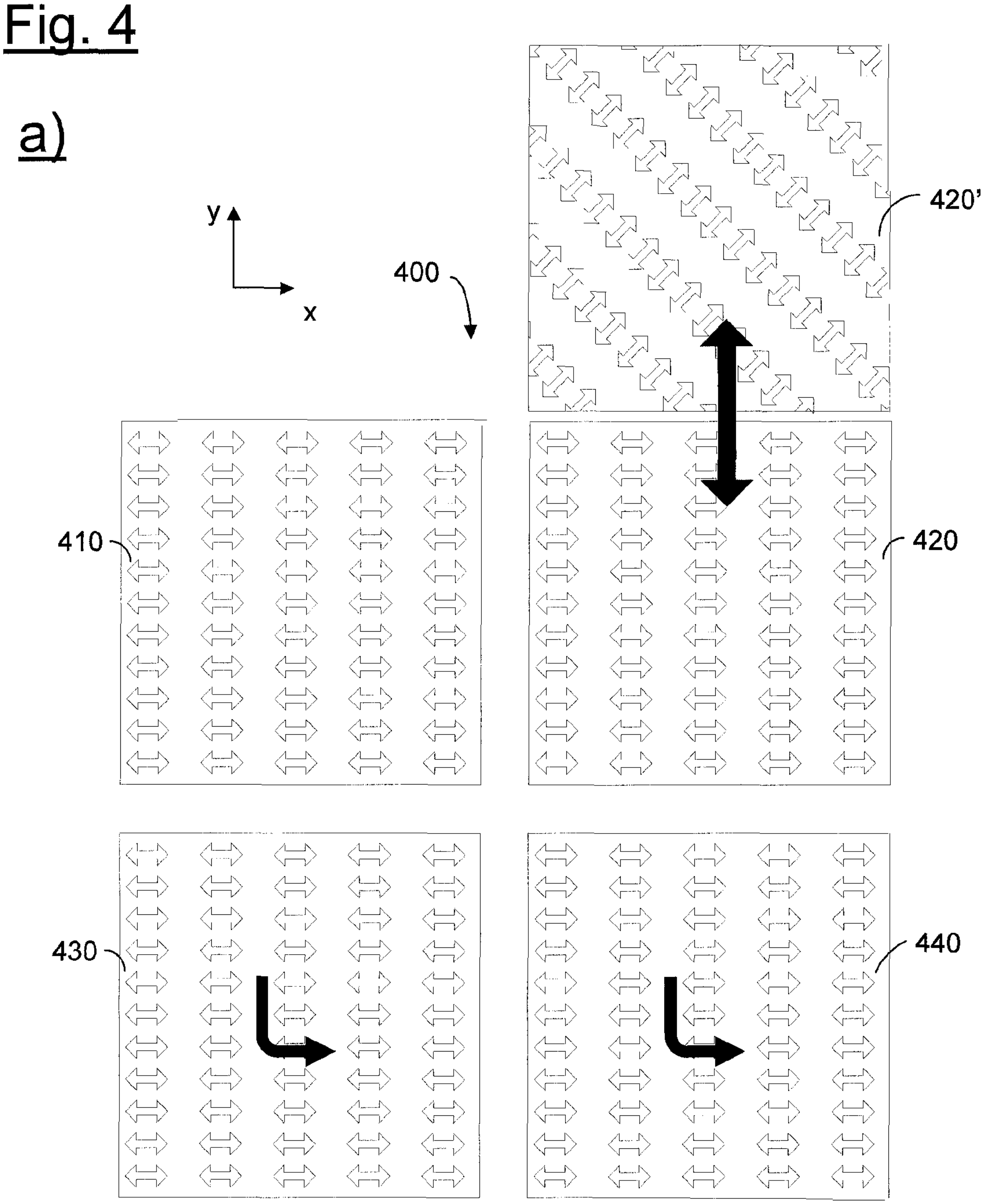
FIGS. 4*a-c* show schematic illustrations for elucidating the functioning of a polarization compensator.
Figure 4:
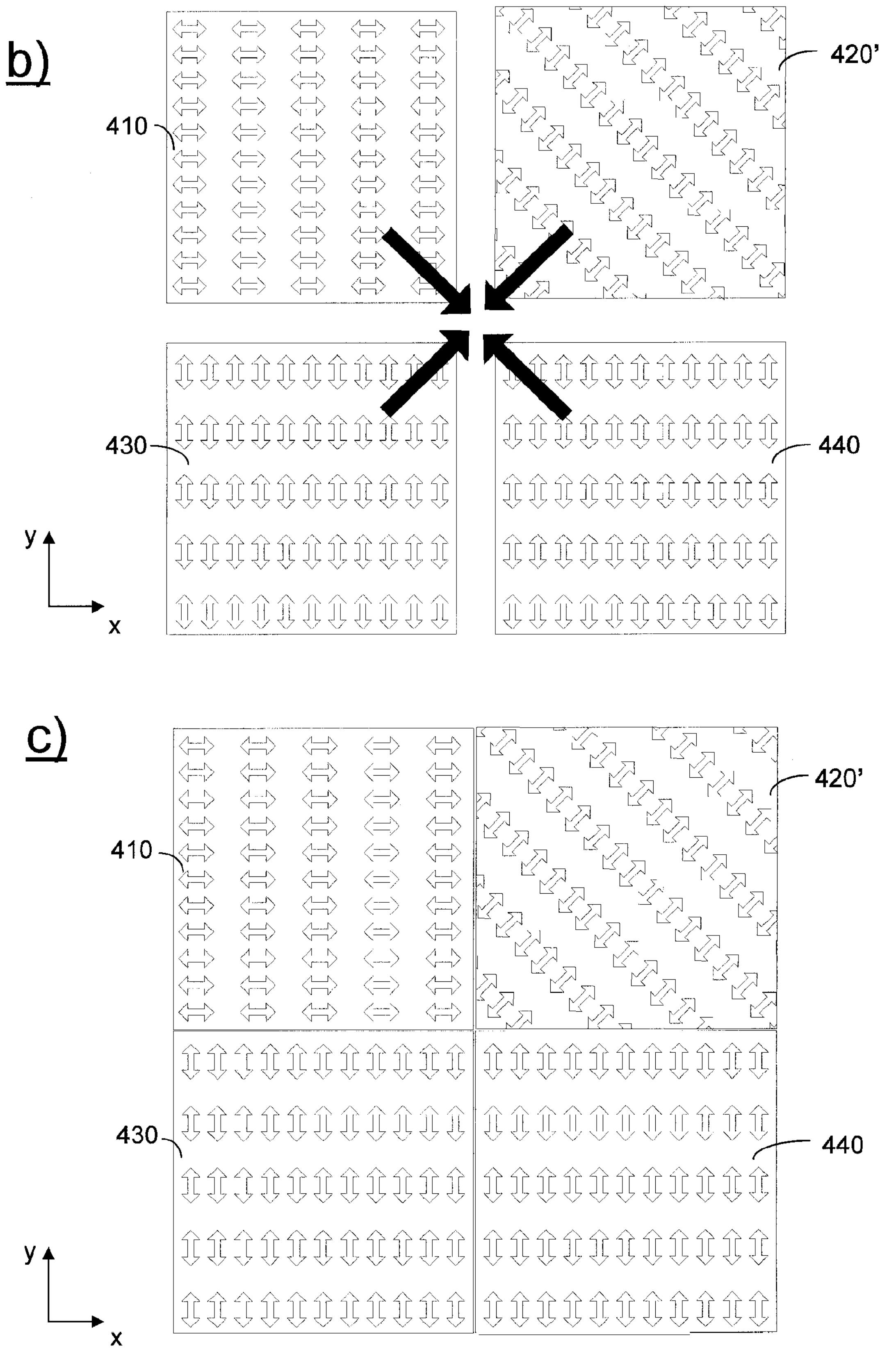

Thus, for instance in accordance with FIG. 3 in the case of a polarization compensator 300 which is composed of four partial plates 310-340 each of square or rectangular geometry and in which, in a starting position shown in FIG. 3*a*, the fast axes of the birefringence match for all the partial plates 310-340 in terms of their orientation (run in the x direction in the system of coordinates depicted), in a first adjustment step in accordance with FIG. 3*a*, the partial plates 310-340 are pushed apart from one another in the direction of the arrows P1-P4 depicted (FIG. 3*a*), then, for example, three partial elements 320, 330 and 340 are rotated by 90° about the respective element axis (parallel to the z direction) (FIG. 3*b*), and, finally, the partial elements 310-340 are pushed together again (FIG. 3*c*) in order to obtain the final configuration shown in FIG. 3*d*.

In this case, the final configuration in accordance with FIG. 3*d* is once again chosen such that it is adapted to a real polarization distribution measured in the optical system or determined from measurements of individual components or modules of the optical system.

In the case of the further polarization compensator 400 illustrated in FIG. 4*a-c*, which, analogously to the polarization compensator 300 from FIG. 3*a-d*, likewise includes four partial elements 410-440 each of square or rectangular geometry, by the manipulator (not illustrated here) in accordance with FIG. 4*a*, in addition to a rotation of two partial elements 430 and 440 by an angle of 90° about the respective element axis (after the relevant partial elements 410-440 have been pushed apart from one another previously), the partial element 420 is exchanged for a partial element 420' having a deviating (by 45° in the example shown) orientation of the fast axis of the birefringence. Once the partial element 420 has been exchanged for the partial element 420', the partial elements 410, 420', 430 and 440 in accordance with FIG. 4*b* are pushed together again by the manipulator in the direction of the optical system axis, thus resulting in the final configuration shown in FIG. 4*c*. The final configuration is once again adapted to the real polarization distribution measured in the optical system or determined from measurements of the individual components or modules in the optical system.

The present disclosure affords the possibility of exerting a comparatively flexible and rapid influence on the polarization state in an optical system, in particular in the illumination device or the projection objective of a microlithographic projection exposure apparatus. In this case, the disclosure makes use of the insight, in particular, that advantageous influencing of the polarization state can also be achieved by virtue of the fact that a targeted correction can be effected in specific pupil regions (with other pupil regions being relatively disregarded). This insight is accompanied by the consideration that, owing to a quadratic relationship existing between a retardation introduced into the optical system, on the one hand, and a resultant alteration of the IPS values (IPS="Intensity in Preferred State"), on the other hand, even an intensification of or deterioration in a polarization disturbance already present in the system can be more than made up for by a reduction or improvement of the polarization disturbance that is obtained in other pupil regions.

Embodiments for the mechanical realization of a manipulator suitable, for example, in the configurations of FIG. 1*a-b* are explained in the following with reference to FIG. 8-10.

Figure 8:
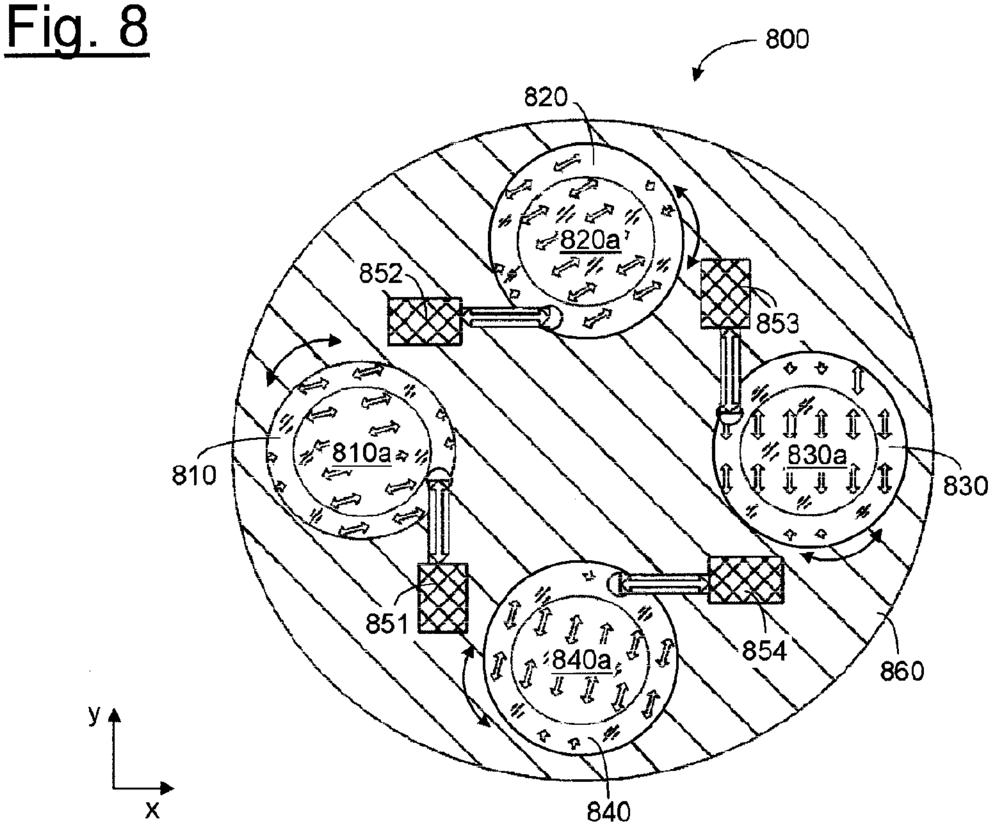
FIGS. 8-10 show schematic illustrations to explain certain manipulators.

According to FIG. 8, polarization-modifying partial elements 810, 820, 830 and 840 are again arranged on a (e.g., light-opaque) screen 860 and are rotatable in the x-y-plane. For this purpose, the Polarization-modifying partial elements 810, 820, 830 and 840 are tappet-actuated by actuators 851-854 forming the manipulator, wherein the points of application of the forces actuated by the actuators 851-854 are at least substantially outside of the optically used regions 810*a*, 820*a*, 830*a*, 840*a* for the quadrupole setting used in this embodiment (as shown in FIG. 5*c*). Optionally, not more than 1% of the total optically used region is covered by the actuators 851-854.

Figure 9:
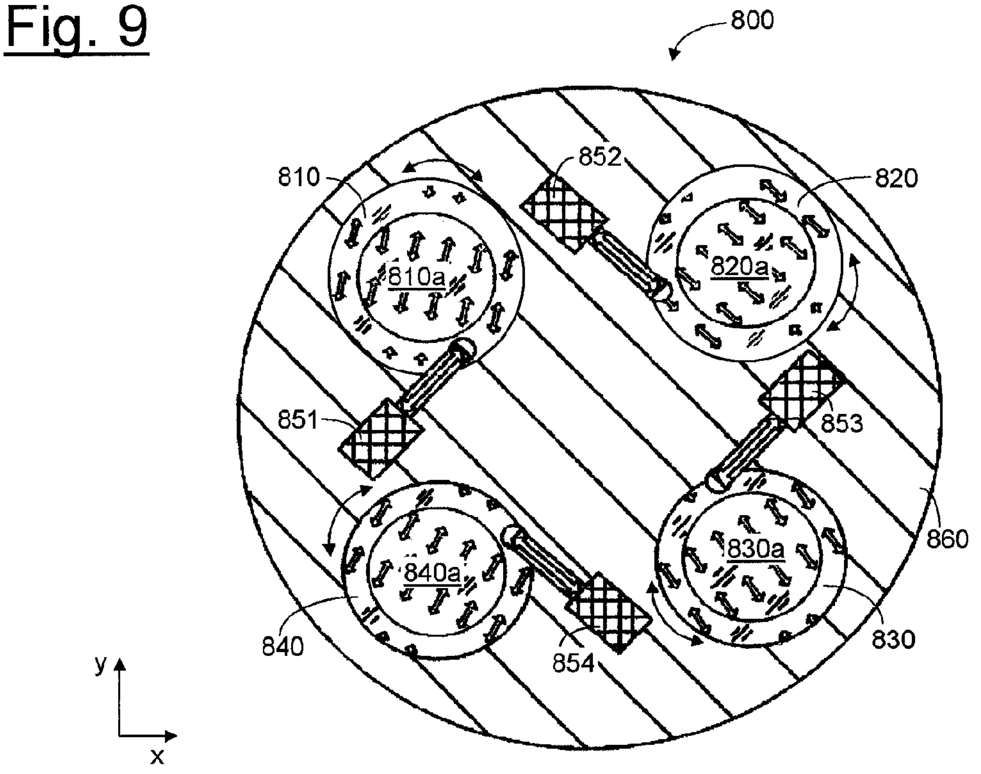

FIG. 9 shows this arrangement after rotation around the optical axis (z-axis) by 45°. This rotation may be realized by a further manipulator which is not shown in FIGS. 8-9 and which can, for example, be arranged outside of the region that can be illuminated with light from the light source.

Figure 10:
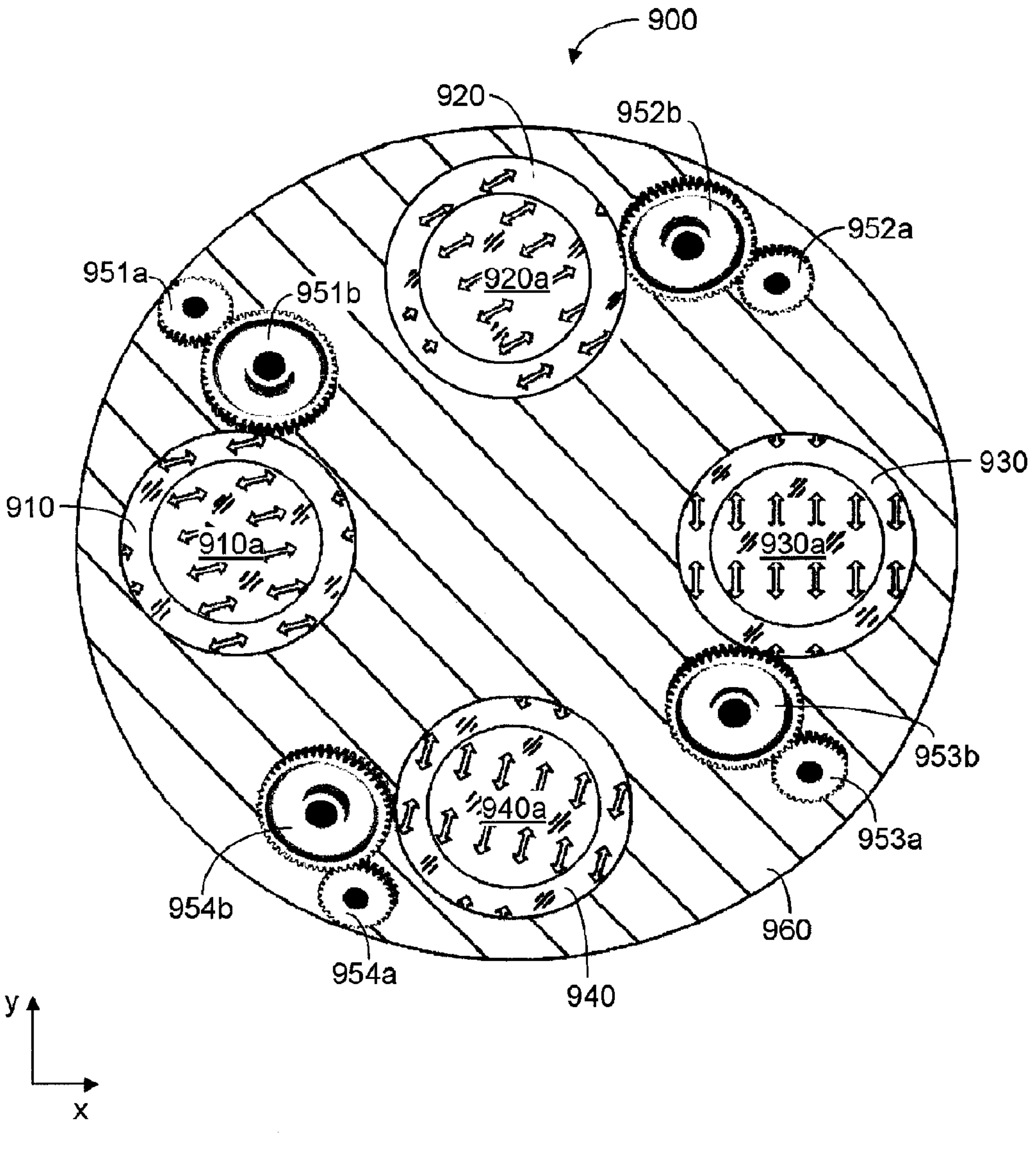

According to FIG. 10, the rotation of polarization-modifying partial elements 910, 920, 930 and 940 is realized by toothed wheels 951*a*, 951*b*, . . . forming the manipulator. For a positive locking (form fit), the peripheral region of the elements 910, 920, 930 and 940 can be provided with a corresponding toothing (not shown in FIG. 10). Alternatively, a frictional connection can be used to transmit the torque to the polarization-modifying partial elements 910, 920, 930 and 940. Again, optionally not more than 1% of the total optically used region is covered by the components of the manipulator (in particular the actuators 951-954).

Figure 7:
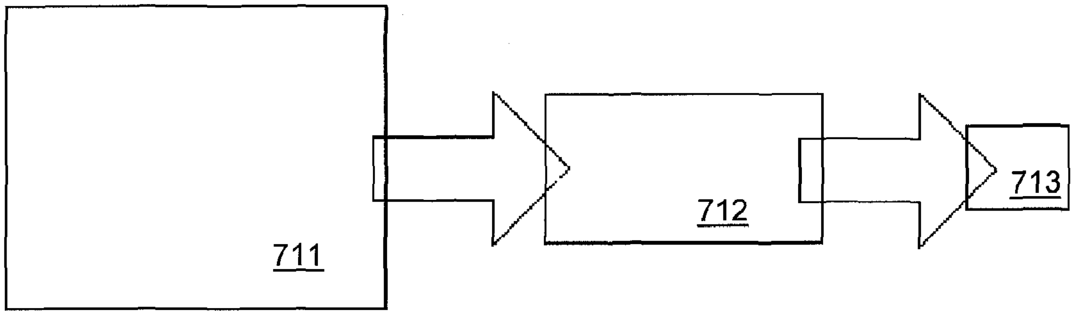
FIGS. 7*a-b* show schematic illustrations to explain a modular arrangement of the manipulator with polarization compensator.
Figure 7:
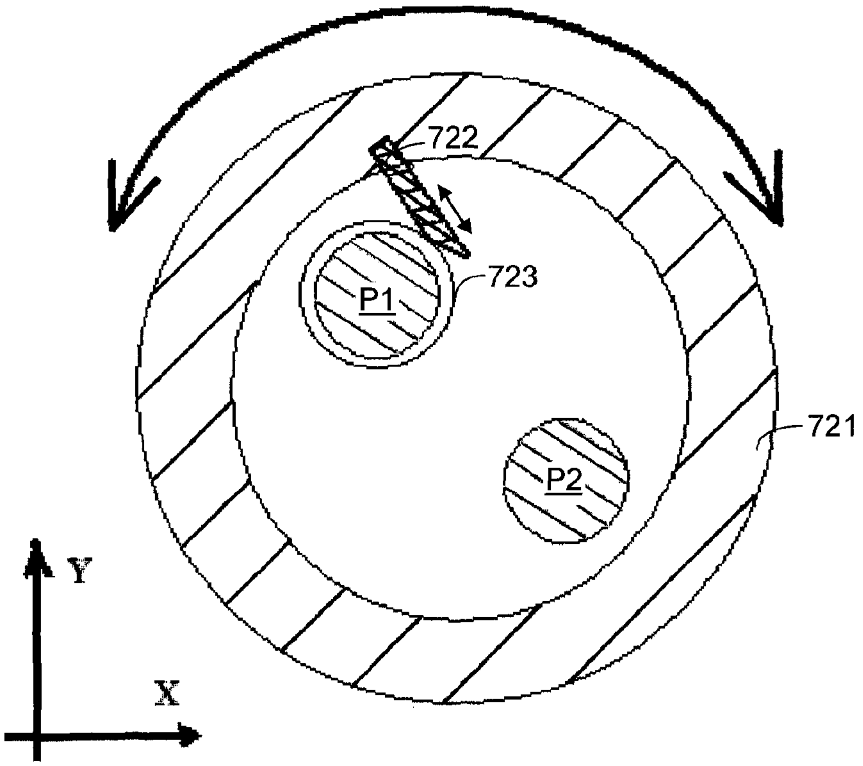

In some embodiments of the disclosure just schematically illustrated in FIG. 7, in addition to the manipulator for altering the position of the at least one polarization-modifying partial element, a second manipulator may be provided by which the position of the first manipulator can be altered. Such a "modular" arrangement is generally illustrated in FIG. 7*a-b*, wherein in FIG. 7*a* block "713" denotes a polarization-modifying partial element, block "712" denotes a first manipulator for changing the position of the element, and 711 denotes a second manipulator for changing the position of the first manipulator 712 (if given together with the polarization-modifying partial element). A possible implementation of this concept is shown in FIG. 7*b*, wherein a polarization-modifying partial element 723 can be rotated in the x-y-plane using a first manipulator 722 (e.g., according to certain embodiments of FIGS. 8-10), and the position of the first manipulator 722 can be altered using a second manipulator 721 such that the first manipulator 723 can be positioned either to cover a first illumination pole P1 or a second illumination pole P2. Accordingly, if the illumination setting is changed, the position of the whole arrangement of first manipulator, second manipulator and polarization-modifying partial element can be altered such that the mechanical manipulator components are placed outside of the optically used region for each of the respective settings. For example, the second manipulator may be arranged outside the region which can be illuminated with the light source, whereas the first manipulator may be arranged in a region which can be illuminated by the light source, but remains at least substantially unilluminated for the specific used illumination setting. In some embodiments, the arrangement of manipulators according to FIGS. 7*a,b* can also be exchanged as a whole.

Even though the disclosure has been described on the basis of certain embodiments, numerous variations and alternative embodiments can be deduced by the person skilled in the art, for example, by combination and/or exchange of features of individual embodiments. Accordingly, it goes without saying for the person skilled in the art that such variations and alternative embodiments are also encompassed by the present disclosure, and the scope of the disclosure is only restricted within the meaning of the accompanying patent claims and the equivalents thereof.

What is claimed is:

1. An optical system having an optical axis, the optical system comprising:

a polarization compensator comprising a first polarization-modifying partial element; and a first manipulator capable of moving the first partial polarization-modifying element;

wherein:

the optical system has a region that is in a plane perpendicular to the optical axis of the optical system;

the optical system has a first illumination setting in which an intensity of light from a light source over the region does not exceed 20% of a maximum intensity in the plane;

the optical system has a second illumination setting configured so that, if the light source emitted light when the optical system is in the second setting, the region would be principally illuminated with light from the light source;

the first manipulator is arranged in the region so that if the light source emitted light when the optical system is in the second illumination setting, the first manipulator would be illuminated by the light from the light source; and the optical system is an illumination device configured to be used in a microlithographic projection exposure apparatus, or the optical system is a projection objective configured to be used in a microlithographic projection exposure apparatus.

2. The optical system according to claim 1, wherein, in the first illumination setting, the intensity of light from the light source over the region does not exceed 10% of the maximum intensity in the plane.

3. The optical system according to claim 1, wherein, in the first illumination setting, the intensity of light from the light source over the region does not exceed 5% of the maximum intensity in the plane.

4. The optical system according to claim 1, wherein the plane perpendicular to the optical axis of the optical system is a pupil plane of the optical system.

5. The optical system according to claim 1, wherein the plane perpendicular to the optical axis of the optical system is a field plane of the optical system.

6. The optical system according to claim 1, wherein the first polarization-modifying partial element comprises birefringent material.

7. The optical system according to claim 1, wherein, during use of the optical system, the first polarization-modifying partial element modifies a ratio of amplitudes of orthogonal polarization states for light passing through the first polarization-modifying partial element.

8. The optical system according to claim 1, wherein, during use of the optical system, the first polarization-modifying partial element modifies a relative phase between orthogonal polarization states for light passing through the first polarization-modifying partial element.

9. The optical system according to claim 1, wherein the polarization compensator further comprises a second polarization-modifying partial element.

10. The optical system according to claim 9, wherein a relative position and/or a relative orientation of the first and second polarization-modifying partial elements can be altered by the first manipulator.

11. The optical system according to claim 9, wherein the first and second polarization-modifying partial elements have a concentric arrangement.

12. The optical system according to claim 11, wherein the first and second polarization-modifying partial elements are arranged concentrically with respect to the optical axis.

13. The optical system according to claim 9, wherein the first and second polarization-modifying partial elements have a polygonal geometry.

14. The optical system according to claim 1, wherein the first manipulator is capable of rotating, displacing and/or tilting the first polarization-modifying partial element.

15. The optical system according to claim 1, further comprising a second manipulator capable of moving the first manipulator.

16. The optical system according to claim 15, wherein the second manipulator is arranged outside the region.

17. The optical system according to claim 1, further comprising an optical element which, during use of the optical system, is capable of causing a disturbance of a polarization state in the optical system.

18. The optical system according to claim 17, wherein the polarization compensator can be set so that the polarization compensator magnifies the disturbance in a first region of a pupil plane of the optical system and reduces the disturbance in a second region of the pupil plane of the optical system.

19. The optical system according to claim 1, further comprising an optical element having a gravity-induced stress birefringence, wherein the polarization compensator is configured to at least partly compensate for the gravity-induced stress birefringence.

20. The optical system according to claim 9, wherein the polarization compensator has first and second settings which differ from one another with regard to an orientation of the first and second polarization-modifying partial elements relative to one another, and the first and second settings match with regard to a geometry of the polarization compensator.

21. The optical system according to claim 1, wherein the optical system has a pupil filter, and the manipulator is arranged on the pupil filter.

22. The optical system according to claim 1, further comprising a neutral filter.

23. The optical system according to claim 1, wherein the first polarization-modifying partial element has an optical crystal axis oriented in a plane perpendicular to the optical axis of the optical system.

24. The optical system according to claim 1, further comprising a light source capable of generating light having a wavelength of less than 250 nm.

25. An apparatus, comprising:
an optical system according to claim 1,
wherein the apparatus is a microlithographic projection exposure apparatus, and the optical system is an illumination device or a projection objective.

26. A method, comprising:
using a microlithographic projection exposure apparatus to produce microstructured components,
wherein the microlithographic projection exposure apparatus comprises an optical system according to claim 1, and the optical system is an illumination device or a projection objective.

27. The method of claim 26, further comprising:
providing a substrate, to which a layer comprising a light-sensitive material is at least partly applied;
providing a mask having structures to be imaged; and
projecting at least one part of the mask onto a region of the layer with the aid of the projection exposure apparatus.

* * * * *